(12) United States Patent
Kim

(10) Patent No.: US 6,194,870 B1
(45) Date of Patent: Feb. 27, 2001

(54) SYSTEM FOR AUTOMATICALLY INDICATING THAT BATTERY SHOULD BE REPLACED AND METHOD THEREOF

(75) Inventor: Ji-Sang Kim, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/415,225

(22) Filed: Oct. 12, 1999

(30) Foreign Application Priority Data

Oct. 9, 1998 (KR) .................................................. 98-42178

(51) Int. Cl.$^7$ ............................. H02J 7/14; G01N 27/416
(52) U.S. Cl. ............................................ 320/134; 324/432
(58) Field of Search .................................. 320/132, 134, 320/136; 324/432

(56) References Cited

U.S. PATENT DOCUMENTS

| | | |
|---|---|---|
| 5,047,961 | 9/1991 | Simonsen . |
| 5,196,779 | 3/1993 | Alexandres et al. . |
| 5,278,487 | 1/1994 | Koenck . |
| 5,321,627 | 6/1994 | Reher . |
| 5,459,671 | 10/1995 | Duley . |
| 5,508,599 | 4/1996 | Koenck . |
| 5,565,759 | 10/1996 | Dunstan . |
| 5,569,550 | 10/1996 | Garrett et al. . |
| 5,631,538 * | 5/1997 | Komrska ................................ 320/155 |
| 5,646,509 * | 7/1997 | Berglund et al. ...................... 713/321 |
| 6,025,695 * | 2/2000 | Freil et al. ............................. 320/106 |

* cited by examiner

Primary Examiner—Peter S. Wong
Assistant Examiner—Gregory J. Toatley, Jr.
(74) Attorney, Agent, or Firm—Robert E. Bushnell, Esq.

(57) ABSTRACT

A system of automatically indicating a user that it is time to replace a rechargeable battery of an electric apparatus includes a battery state detector for detecting whether the battery is in a low battery state, a battery output detector for detecting electrical capacity of the battery which is consumed in the electric apparatus, and a power controller for defining an electrical capacity of the battery to be considered as the life of the battery is over, as a reference electrical capacity for replacement, calculating a total consumed electrical capacity value of the battery by accumulating an electrical capacity value detected by the battery output detector when the battery is in the low battery state, and generating a battery replacement signal when the total consumed electrical capacity value is equal to or less than the reference electrical capacity for replacement. Thus, when an electric apparatus including a rechargeable battery is used, since a user is automatically notified of the time to replace the rechargeable battery, not depending on one's experience, damage such as data loss can be prevented.

28 Claims, 5 Drawing Sheets

SYSTEM FOR AUTOMATICALLY INDICATING THAT BATTERY SHOULD BE REPLACED AND METHOD THEREOF

CLAIM OF PRIORITY

This application makes reference to, incorporates the same herein, and claims all benefits accruing under 35 U.S.C. §119 from my application SYSTEM FOR AUTOMATICALLY INDICATING THAT BATTERY SHOULD BE REPLACED AND METHOD THEREOF filed with the Korean Industrial Property Office on Oct. 9, 1998 and there duly assigned Serial No. 42178/1998.

BACKGROUND OF THE INVENTION

1. Field of the Invention

The present invention relates to an electric apparatus using a rechargeable battery, and more particularly, to a system and method for automatically indicating that a battery should be replaced in an electric apparatus having a power adaptor.

2. Description of the Related Art

Batteries are used in most electric devices, such as portable computer, wireless phone, audio and video equipment, etc. Typically, battery monitoring apparatus and method have been widely used for detecting the voltage or the capacity of the battery and notifying an user the detected voltage or capacity of the battery. In order to provide an user with exact information about the state of the battery, the battery monitoring apparatus and method have used a controller to detect the voltage and the capacity of the battery. The controller of the battery monitoring apparatus, however, need more complicated structures to calculate the voltage and the capacity of the battery while user can not be informed of the exact information about the battery. I have found that with conventional battery monitoring apparatus and method, the structure becomes more complicated, and that it is impossible to correct or otherwise improve the conventional apparatus and method in order to get a more perfect apparatus and method for detecting and indicating that the battery should be replaced or the battery should be abandoned.

In an effort of detecting voltages of the battery and notifying an user when the battery was discharged or should be recharged, various types of controller connected to the battery have been used in electrical machine for detecting voltages of the battery. For example, U.S. Pat. No. 5,047,961 for an Automatic Battery Monitoring System issued to Simonson discloses an instrument monitoring of emergency stand-by batteries during operation of the batteries. The instrument records the conditions of the batteries as well as alerts the operators when the discharge operation. U.S. Pat. No. 5,196,779 for a Battery Maintenance System issued to Alexandres et al. discloses a battery maintenance system for charging, analyzing, discharging and conditioning of a battery. The system displays voltage and capacity to determine whether or not the battery has enough capacity to power equipment for an optimal time period. U.S. Pat. No. 5,321,627 for a Battery Monitor And Method For Providing Operating Parameters issued to Reher discloses a battery monitor monitoring the operating parameters of a battery, for example, the absolute state of charge, the relative state of charge, and the capacity of the battery. U.S. Pat. No. 5,459,671 for a Programmable Battery Controller issued to Duley discloses a controller controlling and motoring charge level, temperature, discharge and recharge of a rechargeable battery. U.S. Pat. No. 5,569,550 for a Battery Pack Having Under Voltage And Over-Voltage Protection issued to Garret et al. discloses a battery system for disconnecting a battery before overcharge condition occurs. I have noticed that the embodiments described by these references do not indicate that the battery should be replaced or abandoned because these references provides only the states of charge, discharge, or recharge in the battery.

Since the above battery monitoring apparatus and methods of detecting the voltages of the battery are insufficient to represent the state of the battery, the alternative methods have been used in the electrical machine for calculating an amount of electric capacity of the battery. In general, a battery initially provides a maximum amount of the electrical capacity which is determined by properties of the battery. The electrical capacity of a battery is indicated by ampere-hour and watt-hour. The ampere-hour is determined by multiplying electric current output from the battery by a period of time for which the battery can be used. The watt-hour is determined by multiplying electric power output from the battery by a period of time for which the battery can be used at the output electric current. Since watt is determined by multiplication of electric current by voltage, the ampere-hour and watt-hour can be converted from one to the other. Since one of either ampere-hour or watt-hour of a battery is measured in an electric apparatus, the other can be obtained. The amount of the electrical capacity can be a standard for determining how long a battery can be used in an electric apparatus.

The electrical capacity varies according to the numbers of time and environment of use. Generally, when about 5% of the total electrical capacity in a battery is left, an electric apparatus hardly works which is referred to as a "low battery" state. Then, the electric apparatus can be used again by replacing it with another battery or recharging the battery if it is rechargeable. Here, the criterion of the low battery state can be determined according to the type of electric apparatus and rechargeable battery for use. In an electric apparatus requiring high degree of precision such as a portable computer, the criterion of a low battery state is very strict, while the criterion of a low battery state is not strict for an electric apparatus which is not demanding a high degree of precision such as a portable illuminator.

Particularly, when a rechargeable battery is discharged and recharged repeatedly, the electrical capacity of the recharged battery becomes lower than the initial electrical capacity of the new battery. A rechargeable battery installed in an electric apparatus generally repeats the discharge and the recharge when in use and then the amount of the electrical capacity of the battery becomes low. Thus, the repeated recharge of the battery shortens the life of the battery. Assuming that the amount of electrical capacity of a rechargeable battery when it is manufactured is 100, it is generally regarded as an appropriate time to replace the battery when the amount of electrical capacity of the rechargeable battery is 50 or less with respect to the initial amount of the initially completely recharged electrical capacity. When it is the most appropriate to replace or abandon the battery depends on the remaining amount of the electrical capacity of the battery or the type of the electric apparatus or battery.

However, it is not easy for user to know when to replace or recharge the battery during using the battery. The user usually anticipates the proper time by experience or should always carry extra batteries for unexpected situations. Since the case of batteries for notebook computers which are relatively large, heavy, and expensive, it is inconvenient to carry extra batteries. Moreover, a DC/DC power board including a power supplying unit and a recharging unit in a rechargeable electric apparatus only supports a function for recharging a built-in rechargeable battery when the external electric power is applied to the rechargeable electric apparatus. Accordingly, when the rechargeable electric apparatus is used at a place where there is no supply of the electric power, the power adapter cannot be used for recharging the battery. A nearly discharged battery causes lots of inconvenience. Furthermore, even if the power adapter is be used, it is inconvenient since a user cannot predict when to replace the battery.

For the purpose of calculating the state of capacity and the life time of the battery and informing an user of when the battery should be recharged, various types of complicated microcontroller and peripheral equipment are used. For example, U.S. Pat. No. 5,278,487 for a Battery Conditioning System Having Communication With Battery Parameter Memory Means In Conjunction with Battery Conditioning issued to Koenck discloses a battery monitor system monitoring battery operation and calculating and displaying battery capacity. U.S. Pat. No. 5,565,759 for a Smart Battery Providing Battery Life And Recharge time Prediction issued to Dunstan discloses a smart battery predicting the remaining life and recharge time of the battery based on battery-specific characteristics. I have found that these embodiments need the more complicated process and apparatus in order to calculate the state of the battery and do not provide an indication that the battery should be replaced or abandoned.

SUMMARY OF THE INVENTION

It is an objective of the present invention to provide an improved apparatus and method for automatically indicating that a battery should be replaced.

It is another object to provide an apparatus and method able to inform an user of the time to replace a battery of electronic apparatus.

It an yet another object to provide an apparatus and method able to indicating that a battery should be abandoned.

It is still another object to provide an apparatus and method for calculating the capacity of the battery.

It is still yet object to provide an apparatus and method for maintaining the battery equipped device in use.

It is still yet another object to provide an apparatus and method for alerting an user to an indication when the user abandons the used battery and needs to prepare a new battery.

It is further object to provide an apparatus and method able to notify an user to use an electric power adapter or to recharging another battery.

These and other objects may be achieved by providing a system of automatically indicating a user the time to replace or abandon a rechargeable battery of an electric apparatus. This system includes a battery state detector for detecting a current of the battery and generating a current state signal, a battery output detector for detecting a voltage of the battery of which electricity is consumed in the electric apparatus and generating a voltage state signal, a power adaptor detector for detecting at every predetermined time whether a power adaptor is connected to and disconnected from the electric apparatus and generating a power adapter connection signal, and a power controller receiving the current state signal, the voltage state signal, and the power adapter connection signal, determining a low level of the battery, a total consumed amount of electric capacity of the battery on the basis of the current state signal, the voltage state signal, and the power adapter connection signal, and generating a battery replacement signal or a battery abandon signal when the total consumed amount of electrical capacity value is equal to or less than the reference electrical capacity and when the state signal shows that the level of the battery is lower than a reference level after the power adapter connection signal shows that there is a disconnection between the apparatus and the power adapter.

Another aspect of the above objects may be achieved by providing a method of automatically indicating a battery replacement time in an electric apparatus. The method includes the steps of calculating a total consumed amount of electrical capacity of the battery of the electric apparatus, determining whether the battery is in a low battery state, and if the battery is not in the low battery state, repeating the above steps. If the battery is in the low battery state, the method further includes the steps of generating a battery replacement signal when the total consumed amount of electrical capacity of the battery calculated in the above calculating step is equal to or less than a predetermined reference electrical capacity for replacement. The method further includes the steps of determining at a predetermined time interval whether a power adaptor is connected to the electric apparatus, recharging the battery until the battery is fully charged if the power adaptor is connected to the electric apparatus, and calculating the total consumed amount of electrical capacity of the battery if the power adaptor is not connected.

BRIEF DESCRIPTION OF THE DRAWINGS

A more complete appreciation of the invention, and many of the attendant advantages, thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
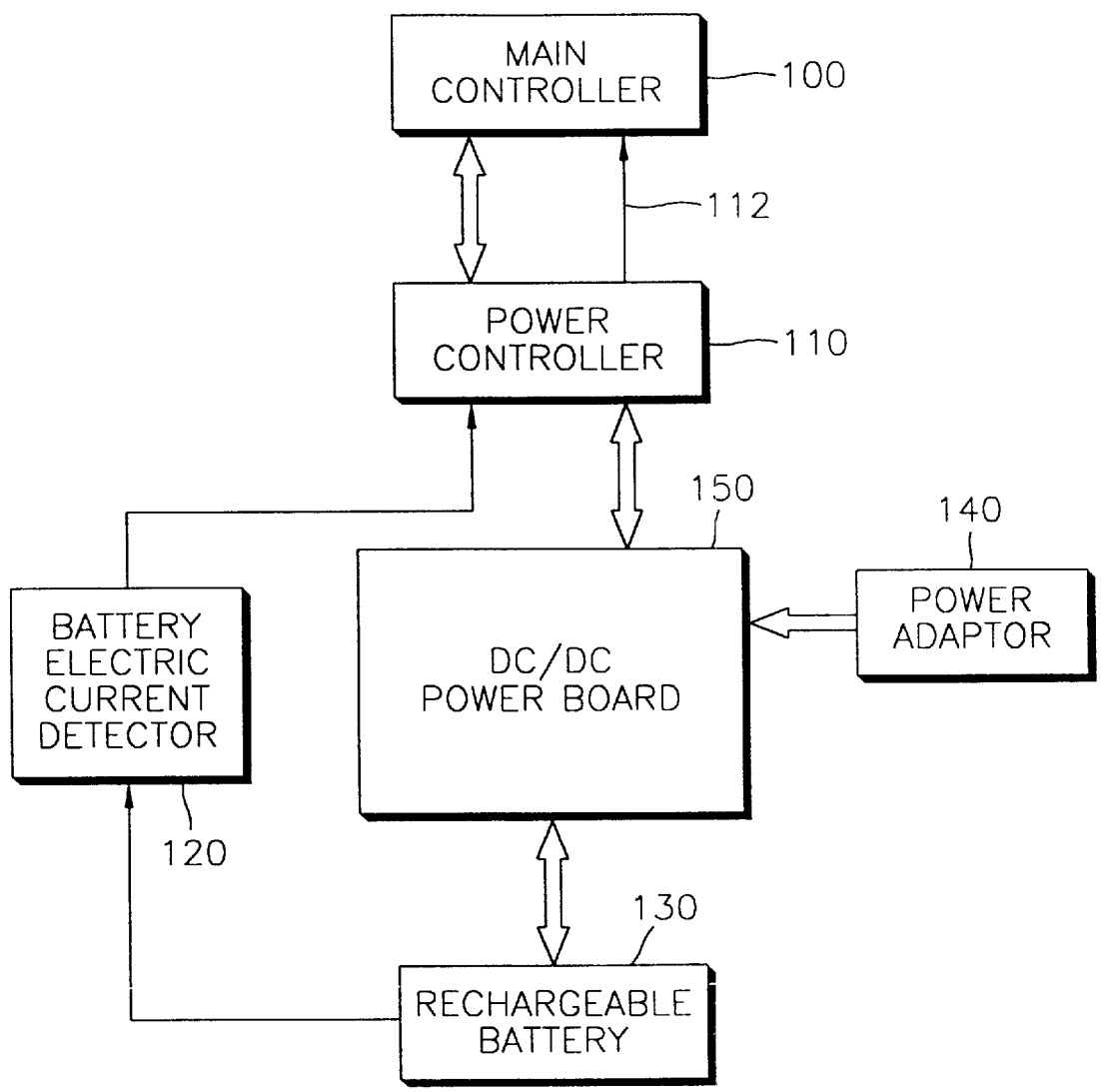
FIG. 1 is a block diagram showing a structure of the power supply in an electric apparatus according to the present invention.
Figure 2:
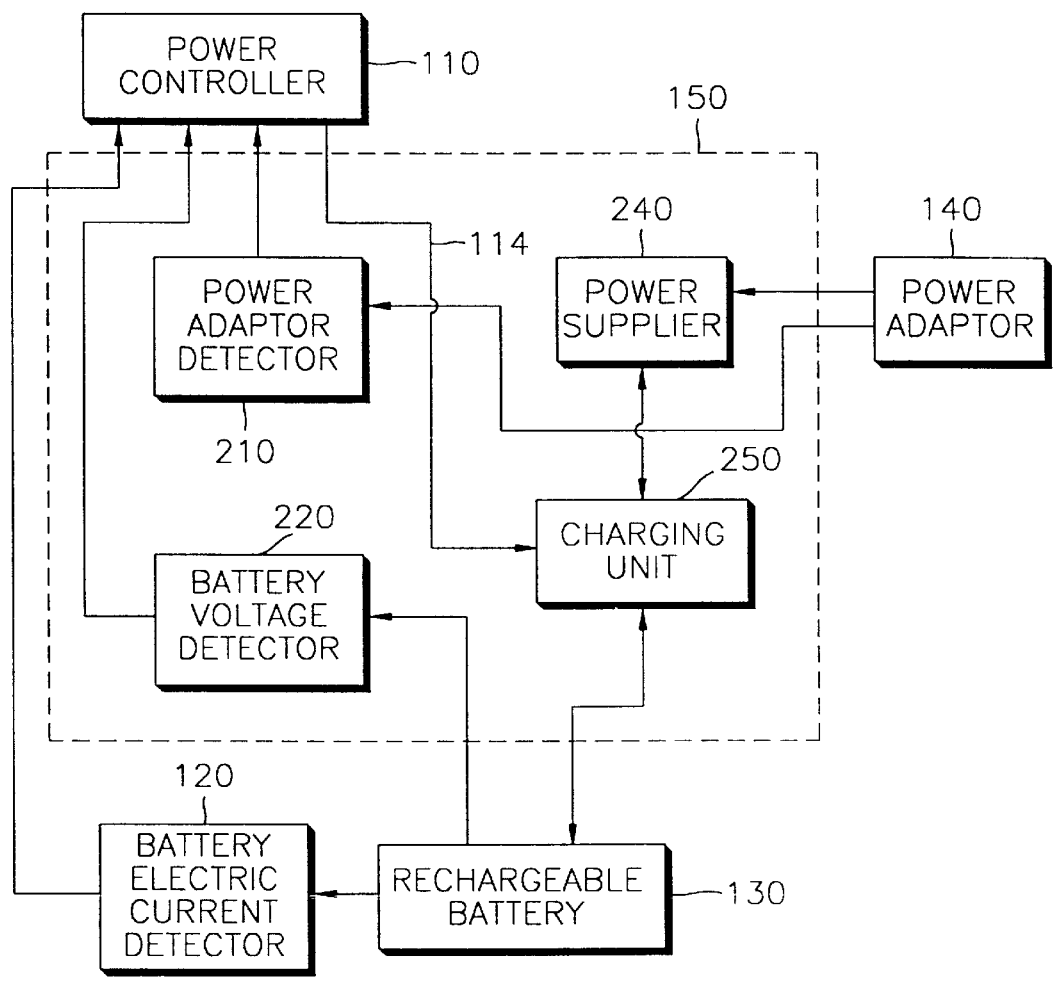
FIG. 2 is a block diagram showing the internal structure of a DC/DC power board in the embodiment shown in FIG. 1.

Turning now to the drawings, FIG. 1 shows a structure of the power supply in an electrical apparatus such as a potable computer or a notebook computer system, and FIG. 2 shows in detail the internal structure of a DC/DC power board shown in FIG. 1. A main controller 100 represents a CPU of the portable computer and includes a memory storing data and signals. Main controller 100 is connected to a power controller 110 via a bus transmitting control signals and data among which an interrupt signal 112 is shown between main controller 100 and power controller 110. Power controller 110 includes a memory storing data and signals. The data and signals stored in power controller 110 can be stored in the memory of main controller. Whenever portable computer turns off, all data and signals are stored one memory of main controller and power controller. A power adapter 140 as an external electric power source is connected to power controller 110 through a DC/DC power board 150 and supplies an electric power to the electric apparatus.

A rechargeable battery 130 is inserted into or connected to the potable computer and connected to a battery electric current detector 120 and power controller through a DC/DC power board. Battery electric current detector 120 measures an output electric current from the rechargeable battery and transmits the value of the output electric current to the power controller 110. The output electric current becomes a factor value for detecting a consumed amount of the electric capacity of the battery. When power adaptor 140 is not connected to the portable, the battery 130 supplies the portable computer with electric power or another rechargeable battery can be used, if needed. Therefore, the electric apparatus uses as an electric power supplied from one of power adaptor 140 and rechargeable battery 130 which are selectively connected to the electric apparatus.

DC/DC power board 150 includes a power supplier 240 and a charging unit 250 which are generally included for recharging battery in rechargeable electric apparatus. As shown in FIG. 2, DC/DC power board 150 includes a power adaptor detector 210, a battery voltage detector 220, power supplier 240, and charging unit 250. Power controller 110 is connected to DC/DC power board 150 via data line and a recharge stop signal 114. The data line includes an adaptor detection signal and a battery voltage signal. The rechargeable battery 130 and the DC/DC power board 150 are connected to each other by a data signal and a power lines. The power adaptor 140 and the DC/DC power board 150 are connected to each other by a signal line and the power line.

When the power adaptor 140 is connected to the portable computer, a state of an adaptor connection signal derived from power adaptor 140 is changed from a high state to a low state. Power adaptor detector 210 detects a change of the state of the adaptor connection signal and transmits the adaptor detection signal to the power controller 110. When the power adaptor 140 is removed or disconnected from the portable computer, the state of the adaptor connection signal is changed from a low state to a high state. Power adaptor detector 210 detects the change of the state of the adaptor connection signal and transmits the adaptor connection signal to the power controller 110. The battery voltage detector 220 is connected to the rechargeable battery 130 and detects a status of the battery by measuring an output voltage of the rechargeable battery and transmits the measured value to the power controller 110.

If the power adaptor 140 is connected to the portable computer, the power supplier 240 supplies electric power to the portable computer by receiving the electric power from the power adaptor 140. When the rechargeable battery 130 is recharged, the power supplier 240 supplies the charging unit 250 with the electric power. When the power adaptor 140 is not connected to the portable computer, the electric power is supplied from rechargeable battery 130 to the notebook computer through charging unit 250 and power supplier 240. Power supplier 240 supplies each component of the portable computer with the electric power which is received from rechargeable battery 130. Charging unit 250 is connected to rechargeable battery 130. If power adaptor 140 is not connected to the charging unit 250, the electric power supplied by the rechargeable battery 130 is supplied to the power supplier 240. When the power adaptor 140 is connected and the rechargeable battery 130 is not completely recharged, the rechargeable battery 130 is charged by the power supplier 240 and charging unit 250. When battery 130 is complete recharged, power controller 110 generate a charge stop signal 114 and transmits the charge stop signal 114 to charging unit 250. Charging unit 250 stops recharging operation by receiving the charge stop signal 114.

Figure 3:
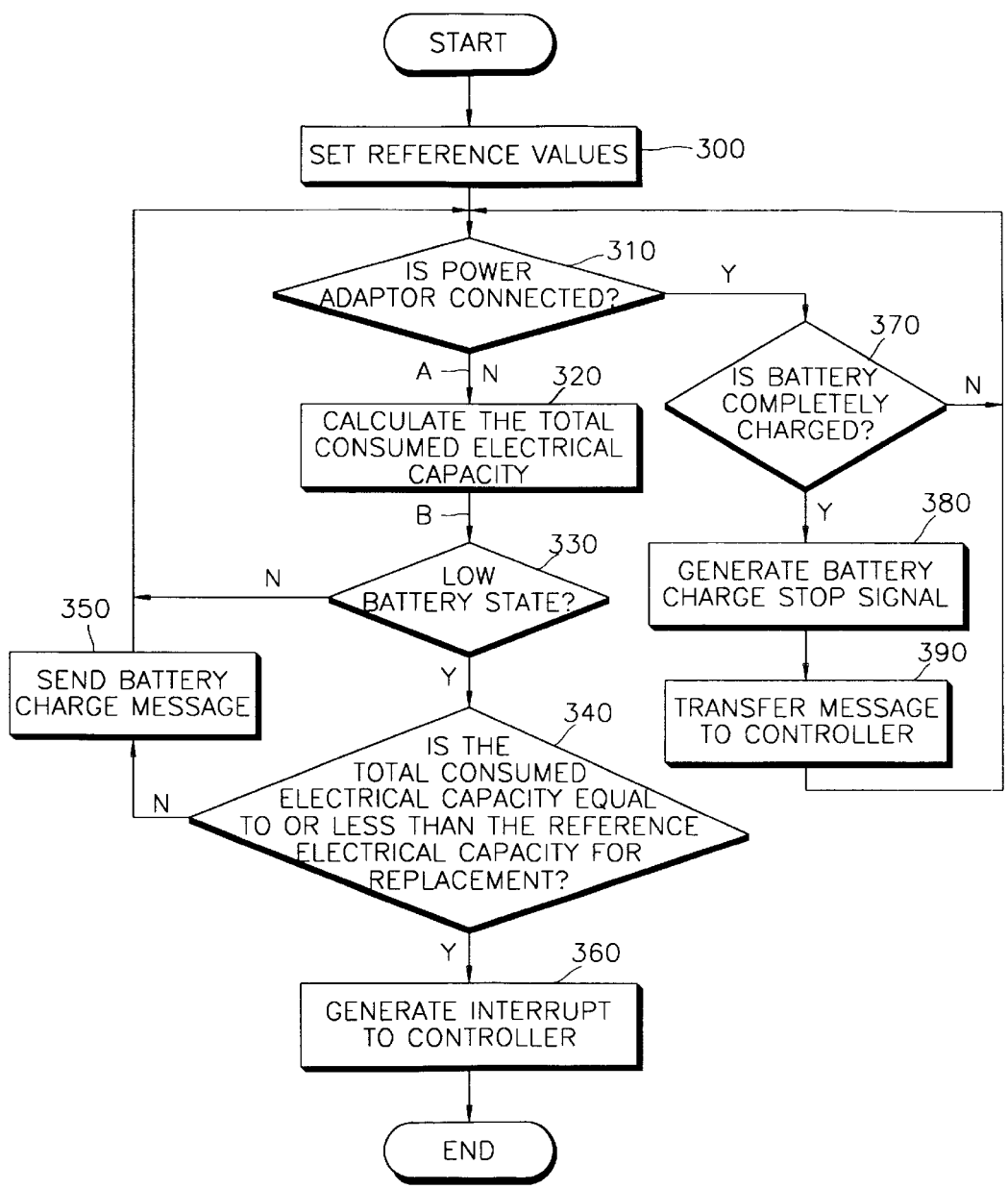
FIG. 3 is a flow chart providing the operation of the system according to the present invention.

FIG. 3 is a flow chart showing a operation of power controller 110. Reference values are set in step 300 such as a detected period of time representing whether the power adaptor 140 is disconnected or connected, a rated amount of electrical capacity, a rated voltage level of the rechargeable battery 130, a state of a low battery, a reference amount of electricity capacity for replacing or abandoning the consumed battery; and a total amount of electricity capacity value that the battery has consumed.

The method of calculation of defining the low battery state by which the rechargeable battery should be recharged is as follows.

$$V_{low} = k1 \times V \qquad \text{[Equation 1]}$$

Here, "V" is the rated voltage of a battery and "$V_{low}$" is the voltage of a low battery. "k1" is a constant determined by the type of an electric apparatus to be used by a user or a battery used for the electric apparatus.

Figure 5:
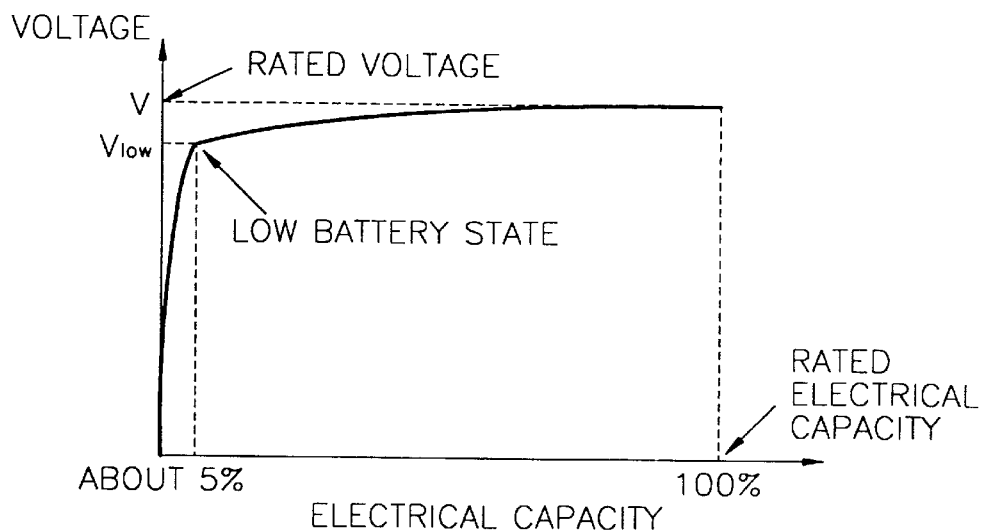
FIG. 5 is a graph indicating the relationship between an amount of the electric capacity and a level of the voltage of a battery in use.

FIG. 5 shows the relationship between the amount of electric capacity and the level of voltage of a battery in use. In the graph, it can be seen that the initial rated voltage of a battery in a completely charged state is lowered with the number of uses and recharges of the battery. Thus, when the amount of the electrical capacity becomes about 5% of the rated electrical capacity, the battery changes to a low battery state.

A method of calculating a reference electrical capacity for replacing the consumed battery is as follows.

$$Wh_c = k2 \times Wh \qquad \text{[Equation 2]}$$

Here, a rated electrical capacity of a battery is Wh, and a criterion of electrical capacity for replacing the battery is $Wh_c$. "k2" is a constant determined according to the type of an electric apparatus or a battery used in the electric apparatus.

Figure 6:
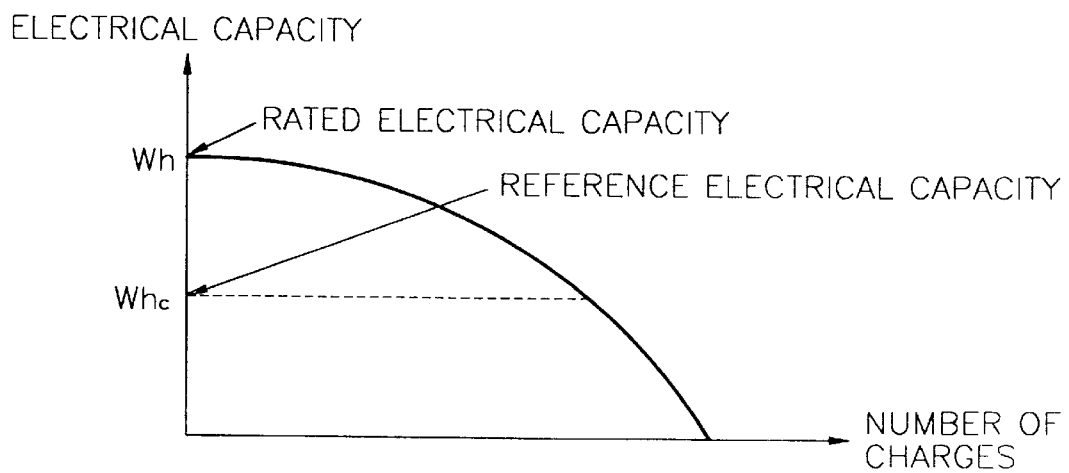
FIG. 6 is a graph indicating the relationship between the number of recharging times and an amount of the electric capacity when a rechargeable battery is recharged.

FIG. 6 shows the relationship between the number of recharges battery and an amount of the electrical capacity of the battery when completely charged. It can be seen that the recharged maximum amount of electrical capacity of the battery decreases as the number of recharges increases.

Step 300 setting reference values includes the step of determining values of k1, k2, and the constants used in the above equations. In step 310, a controller checks whether power adaptor 140 is connected to the portable computer by detecting a state of the adaptor detection signal. When the power adaptor 140 is connected, the controller checks whether the battery 130 is fully charged in step 370. In a preferred embodiment of the present invention, whether the rechargeable battery 130 is fully charged is checked by using the following property of the recharging process. The output voltage of the battery increases while the rechargeable battery is being charged. The output voltage, however, no longer increases when the battery has been fully recharged. There will be no change of the rate of the voltage in terms of time if the battery is fully recharged. Therefore, by detecting the rate of changes in voltage substantially become "0", it is determined that the battery is fully charged. In determining whether rechargeable battery 130 is fully charged, another property of the battery may be utilized. The temperature of the battery increases when the battery is recharged and no longer increases when the battery is fully charged. The power controller 110 measures the temperature of the battery at predetermined intervals obtains the rate of changes in temperature. If this rate of change substantially becomes "0", the battery is determined to be fully charged.

If the rechargeable battery 130 is not fully charged, the process returns to step 310 in which controller checks whether the power adaptor 140 is connected to portable computer. If the battery is fully charged, a battery charge stop signal 114 is generated from charging unit 250 to power controller 110 in step 380. A message indicating a fully charged state of the battery 130 is transferred from power controller 130 to main controller 100 instep 390, and then the process returns to the step 310 for checking whether the power adaptor 140 is connected to portable computer. If the power adaptor 140 is disconnected, electric power is supplied from battery 130 to portable computer through DC/DC power board 150. Electric current detector 120 detects electric current signal transferred from the battery. The total consumed amount of the electrical capacity of the rechargeable battery 130 is calculated by using the value of the battery electric current signal after the battery is full charged and the power adaptor 140 is disconnected in step 320.

Figure 4:
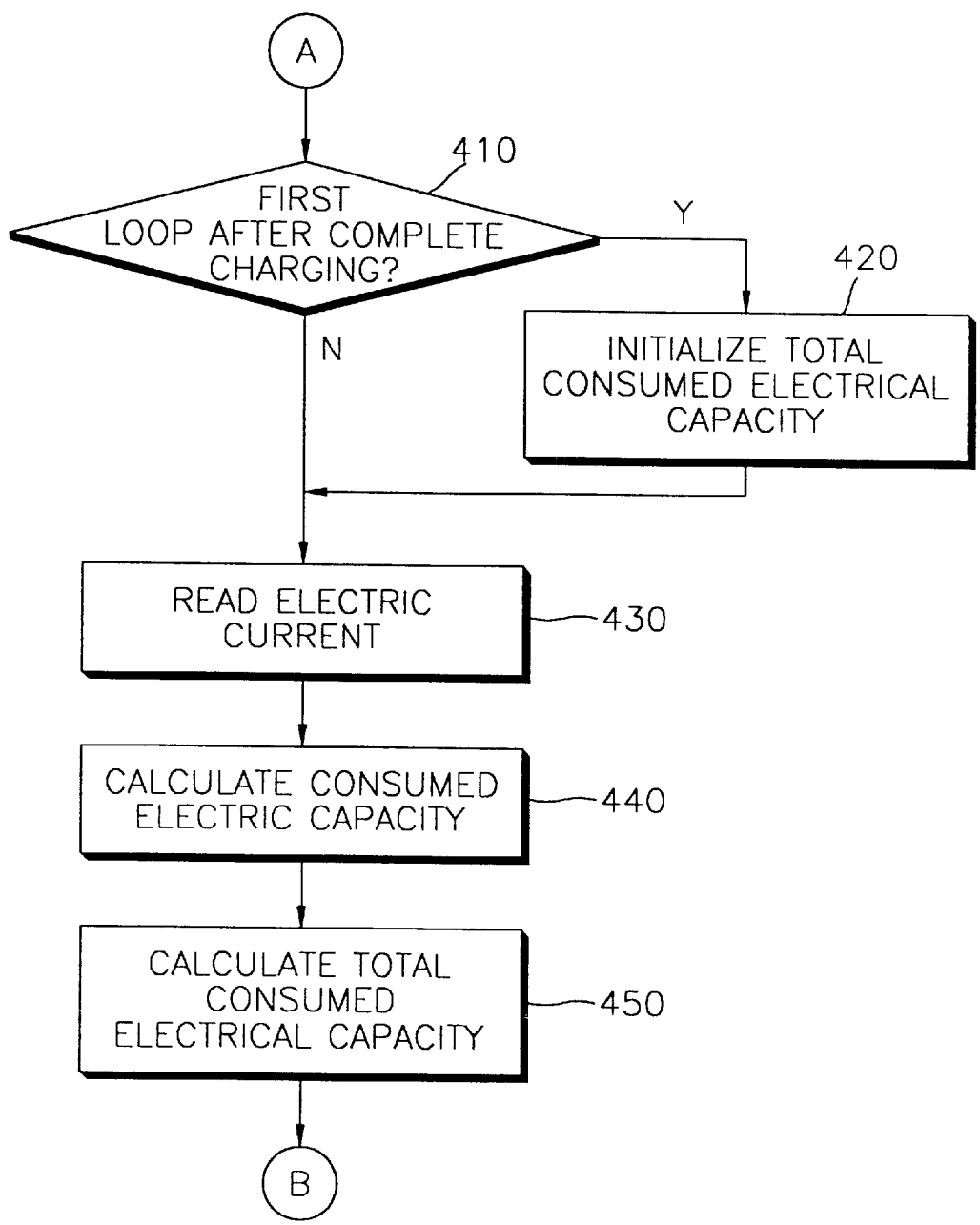
FIG. 4 is a flow chart for providing a process of calculating an consumed amount of the electric capacity in the embodiment shown in FIG. 3.

Referring to FIG. 4, the above method of calculating total consumed amount of the electrical capacity of the rechargeable battery 130 is described as follows. In step 410, the controller determines whether the rechargeable battery 130 begins to discharge after being fully charged. If the discharge is determined to be the first time, the calculation of the consumed total amount of consumed electrical capacity is initialized in step 420. Power controller 110 reads electric current value of the rechargeable battery transferred from the battery electric current detector 120. In step 430, however, if the discharge is not the first time, the total consumed amount of electrical capacity is not initialized, and then the electric current value is of the battery is read in step 430. The electric current value is detected at predetermined time intervals to calculate the consumed electrical capacity in step 440. The consumed amount of electrical capacity value is added to the current total consumed amount of electrical capacity which was calculated after the battery was fully charged. That is, the controller adds a first consumed amount of electric capacity calculated during a first on state of the portable computer to a second consumed amount of electric capacity calculated during a second on state of the portable computer in order to calculate a total consumed amount of electric capacity of the battery during the disconnection between the portable computer and external power source. The first and second consumed amount of electric capacity are stored in a memory (not shown) of the main controller. Whenever the portable computer turns off, the calculated consumed amount of electric capacity is stored in the memory until the power adapter 140 is connected to the portable computer. The result of the summation of the consumed amount and the current total consumed amount of electrical capacity is set to be a new total consumed electrical capacity in step 450. This new total consumed amount of the electrical capacity becomes a value of consumed amount of the electrical capacity consumed by the rechargeable battery 130 after the battery was fully charged. The power controller 110 can calculates the total consumed amount of the electric capacity in step 340 by using the consumed amount of the electric capacity calculated in step 340 regardless of the on and off state of the portable computer since the power adaptor 140 has been disconnected from portable computer.

The total consumed amount of the electrical capacity is used in step 320. The controller reads the value of voltage generated by the battery voltage detector 220 in step 330. The value of voltage is compared with the reference value of voltage representing a low battery state and it is checked whether the rechargeable battery 130 is in the low battery state in step 330. If the battery is not in the low battery state, the process returns to the step 310 for checking whether the power adaptor is disconnected.

If the rechargeable battery 130 is in a low battery state, when the total consumed amount of the electrical capacity of the battery is greater than the reference electrical capacity for replacement of the battery (step 340), it is not necessary to replace or abandon the battery 130 yet. Thus, a message indicating that it is necessary to recharge the rechargeable battery 130 is transferred to the main controller 100 in step 350, and then the controller checks whether the power adaptor 140 is disconnected in step 310. However, if the total consumed amount of the electrical capacity of the battery is equal to or less than the reference electrical capacity for replacing the battery in step 340, an interrupt 112 is generated from power controller 110 to main controller 100 in step 360. Therefore, a warning message such as "the battery should be replaced" or "the battery should be abandoned" is notified to a user through a screen or audio devices according to previously defined interrupt service routines (not shown). If the amount of the electrical capacity consumed between the fully charged state and the low battery state is equal to or less than the replacement reference values compared to the rated electrical capacity of a battery, the controller regards the battery as a low performance state battery, and then the main controller 100 generates a message representing theat the battery should be replaced or abandoned.

If the level of the low voltage state and the replacement reference value of the electric capacity is set higher than the actual low voltage and the actual replacement reference value, the user can be notified before the battery reaches the actual low voltage state and the actual replacement reference value. Therefore, the user can prepare the extra battery or the external electric power source in advance before the battery reaches the actual low voltage state and the actual replacement reference value or before the user fully consumes the electric power of the battery. Depending on the user's preferable period of time such as 10 minutes or 20 minutes for the user to prepare the extra battery or the external electric power source before the battery reaches the actual low voltage state and the actual replacement reference value or before the user fully consumes the electric power of the battery, the level of the low voltage state and the replacement reference value of the electric capacity can be adjusted. In this case, the user can be notified that the battery will be consumed in 10 minutes or 20 minutes.

It is sufficient to notify an user a message representing that charging the battery is completed after the battery is fully charged in step 390. However, if the battery 130 is used up, an interrupt signal 112 is generated to alert an user to facts that an urgent situation of a loss of data may happens.

As described above, according to the principle of the present invention, an user can change the used battery to other one, connect the electric apparatus to an external electric power source through the power adapter, or prepare an extra battery in order to prevent a loss of data and use the electric apparatus without unexpected discontinuity between the electric apparatus and the electric power source since a system notify the user an indication the time to replace or abandon a rechargeable battery used in an electric apparatus. This system includes a controller determining a low level of the battery, a total consumed amount of electric capacity of the battery on the basis of the current state signal, the voltage state signal, and the power adapter connection signal, and generating a battery replacement signal or a battery abandon signal when the total consumed amount of electrical capacity value is equal to or less than the reference electrical capacity and when the state signal shows that the level of the battery is lower than a reference level after the power adapter connection signal shows that there is a disconnection between the apparatus and the power adapter.

What is claimed is:

1. A system in an electric apparatus having a battery, comprising:

a current detector connected to said battery, monitoring electric current of said battery;

a voltage detector connected to said battery, monitoring an electric voltage of said battery;

a power source detector connected to an external electric power source, monitoring a disconnection between said external electric power source and said electric apparatus; and a controller connected to said current detector, said voltage detector, and said power source detector, calculating a first amount of electric capacity of said battery consumed by said electric apparatus in dependence on a first occurrence of on state of said electric apparatus during continuity of said disconnection, making a determination of whether said first amount is less than a first reference when said voltage is lower than a second reference, generating a signal indicating that said battery should be replaced in dependence on said determination, said current, said voltage, and said disconnection.

2. The system of claim 1, said controller generating a second signal indicating that said battery should be charged when said first amount is more than said first reference.

3. The system of claim 1, said controller storing said first amount in dependence on said first occurrence.

4. The system of claim 3, said controller calculating a second amount of said electric capacity of said battery consumed by said electric apparatus in dependence on a second occurrence of on state of said electric apparatus during continuity of said disconnection and said voltage.

5. The system of claim 4, said controller generating a total consumed amount of said electric capacity by adding said second amount to said first amount, making a second determination of whether said total consumed amount is less than said first reference when said voltage is lower than said second reference, generating said signal in response to said determination.

6. The system of claim 5, said controller generating a second signal indicating that said battery should be charged when said total amount is more than said first reference.

7. The system of claim 1, said controller calculating a total amount of consumed electrical capacity of said battery by summing all of each amount of electric capacity of said battery consumed by said electric apparatus in dependence on every s occurrence of on state of said electric apparatus during continuing of said disconnection until said voltage is lower than said second reference.

8. The system of claim 7, said second reference varying by a charging characteristic of said battery.

9. The system of claim 7, said controller generating said signal when said total amount of consumed electrical capacity becomes different from said first reference after said voltage is lower than said second reference.

10. The system of claim 9, said first reference varying by a predetermined charging characteristic of said battery.

11. The system of claim 1, said controller generating said signal both when said external power source is disconnected from said electric apparatus and when said voltage of said battery is different from said second reference.

12. The system of claim 1, said controller notifying an user one selected from a group of replacement of said battery, abandonment of said battery, connection between said electric apparatus and said external power source in accordance with said determination.

13. The system of claim 1, said controller terminating calculation of said first amount when said continuity of said disconnection is interrupted.

14. A system in an electric apparatus having a battery, comprising:

a battery detector connected to said battery, monitoring a state of said battery;

a power source detector connected to an external electric power source, monitoring a disconnection between said external electric power source and said electric apparatus; and a controller connected to said battery detector and said power source detector, calculating a total amount of electric capacity of said battery consumed by said electric apparatus in dependence upon on state of said electric apparatus during said disconnection, making a determination of whether said total amount is different from a first reference when said state of said battery is different from a second reference, generating a signal indicating that said battery should be replaced in dependence on said determination.

15. The system of claim 14, said controller adding a first consumed amount of electric capacity calculated during a first occurrence of on state of said electric apparatus to a second consumed amount of electric capacity calculated during a second occurrence of on state of said electric apparatus in order to calculate said total amount of electric capacity of said battery during continuity of said disconnection between said electric apparatus and said external power source.

16. The system of claim 15, said controller storing said first consumed amount and said second consumed amount.

17. The system of claim 14, said battery detector including a current detector and a voltage detector each connected to said battery, monitoring said state having electric current and electric voltage of said battery.

18. The system of claim 14, said first reference varying by a plurality of charging characteristics of said battery.

19. The system of claim 14, said controller generating a second-signal indicating that said battery should be charged when said total amount is more than said first reference after said state has been lower than said second reference.

20. The system of claim 14, said controller terminating calculation of said total amount when said continuity of said disconnection bas been interrupted.

21. The system of claim 20, said controller initiating a second calculation of a second total amount of electric capacity of said battery consumed by said electric apparatus when said disconnection occurs, making a second determination of whether said second total amount is different from said first reference when said state is lower than said second reference, generating said signal in response to said second determination.

22. A process in an electric apparatus having a battery, comprising the steps of:

monitoring a state of said battery;

monitoring a disconnection between said external electric power source and said electric apparatus;

calculating a total consumed amount of electrical capacity of said battery consumed by said electric apparatus during continuity of said disconnection between said external electric power source and said electric apparatus;

making a first determination of whether said total consumed amount is different from a first reference when said state of battery is different from a second reference; and generating a signal representing replacement of said battery in response to said first determination.

23. The process of claim 22, further comprised of the step of adjusting said first reference in accordance with a plurality of changing characteristics of said battery.

24. The process of claim 22, further comprised of the step of adding a first consumed amount of electric capacity calculated during a first occurrence of on state of said electric apparatus to a second consumed amount of electric capacity calculated during a second occurrence of on state of said electric apparatus in order to calculate said total consumed amount of electric capacity of said battery during said continuity of said disconnection between said electric apparatus and said external power source.

25. The process of claim 22, further comprised of the step of initiating calculating said total consumed amount of electrical capacity of said battery after a disconnection of said electric apparatus and said external power source occurs.

26. The process of claim 22, further comprised of the step of:

monitoring electric voltage of said battery included in said state;

calculating a first consumed amount of electric capacity of said battery;

making a second determination of whether said electric apparatus is off state in response to said electric voltage;

terminating calculation of said first consumed amount of electric capacity of said battery in response to said second determination; and storing said first consumed amount of electric capacity of said battery.

27. The process of claim 26, further comprised of the step of:

making a third determination of whether said electric apparatus is on state in response to said electric voltage;

initiating calculation of a second consumed amount of electric capacity of said battery; and adding said second consumed amount to said first consumed amount of electric capacity of said battery so as to calculate said total consumed amount.

28. The process of claim 22, further comprising the steps of:

terminating said total consumed amount when said electric apparatus is connected to said external electric power source;

calculating a second total consumed amount of electric capacity of said battery consumed by said electric apparatus when said disconnection occurs;

making a second determination of whether said second total amount is different from said first reference when said state is different from said second reference; and generating said signal in response to said determination.

* * * * *